United States Patent [19]
Poklemba

[11] Patent Number: 5,696,796
[45] Date of Patent: Dec. 9, 1997

[54] CONTINUOUSLY VARIABLE IF SAMPLING METHOD FOR DIGITAL DATA TRANSMISSION

[75] Inventor: John James Poklemba, Ijamsville, Md.

[73] Assignee: Comsat Corporation, Bethesda, Md.

[21] Appl. No.: 483,764

[22] Filed: Jun. 7, 1995

[51] Int. Cl.⁶ .......................... H03K 9/00; H04L 27/06; H04L 27/14; H04L 27/22
[52] U.S. Cl. .......................... 375/316; 332/103
[58] Field of Search .......................... 375/316, 326; 332/103; 329/129

[56] References Cited

U.S. PATENT DOCUMENTS

| | | | |
|---|---|---|---|
| 3,864,632 | 2/1975 | Chang | 325/42 |
| 3,868,658 | 2/1975 | Kiemle | 340/173 |
| 4,308,502 | 12/1981 | Brolin | 328/151 |
| 4,403,036 | 9/1983 | Hartley et al. | 435/317 |
| 4,481,646 | 11/1984 | Godard | 375/77 |
| 4,485,404 | 11/1984 | Tults | 358/195.1 |
| 4,506,228 | 3/1985 | Kammeyer | 329/107 |
| 4,707,841 | 11/1987 | Yen et al. | 375/106 |
| 4,773,083 | 9/1988 | Baumbach et al. | 375/100 |
| 4,859,960 | 8/1989 | Standford et al. | 329/126 |
| 4,896,336 | 1/1990 | Henely et al. | 375/80 |
| 5,130,802 | 7/1992 | Ruprecht et al. | 358/188 |
| 5,225,795 | 7/1993 | Iinuma | 332/100 |
| 5,265,126 | 11/1993 | Yoshikawa | 375/27 |
| 5,311,550 | 5/1994 | Fouche et al. | 375/38 |
| 5,375,146 | 12/1994 | Chalmers | 375/350 |
| 5,515,400 | 5/1996 | Arai | 375/261 |
| 5,535,245 | 7/1996 | Kim | 345/261 |

OTHER PUBLICATIONS

*Single Chip Digital Down Converter Simplifies RF DSP Applications*, D. Chester et al, RF Design, Nov. 1992.
*A Digital Turner for Wideband Receivers*, C. Olmstead et al., DSP Applications, Sep. 1992, pp. 2–7.
*Undersampling Techniques Simplify Digital Radio*, R. Groshong et al., Electronic Design, May 23, 1991, pp. 3–95 to 3–101.
*Exploit Digital Advantages in an SSB Receiver* by R. Groshong et al., Electronic Design, Jun. 23, 1991, pp. 3–103 to 3–107.
*Using Wide Dynamic Range Converters for Wide Band Radios* by B. Brannon, RF Design, May 1995, pp. 50–65.
*Digital IF Processing* by C. Olmstead et al., RF Design, Sep. 1994, pp. 30–40.

Primary Examiner—Stephen Chin
Assistant Examiner—Mohammad Ghayour
Attorney, Agent, or Firm—Sughrue, Mion, Zinn, Macpeak & Seas, PLLC

[57] ABSTRACT

A sampling method, denoted continuously variable IF sampling (CVIFS), implemented in digital transmission and reception components is characterized by sampling a bandpass signal which is centered at an intermediate frequency $f_{IF}$ that is related to both the data transmission symbol rate $(R_s)$ and sample rate $(NR_s)$ by integer ratios. Moreover, the CVIFS method is characterized in that the sample rate $NR_s$ is constrained to be four times the IF center frequency, and both the sample rate $NR_s$ and the IF center frequency are constrained to be within a range of a factor of 1.5 of their maximum values. To maintain this high sample rate as the data symbol rate is lowered, a "gear shifting" technique is utilized whereby the integer number of samples-per-symbol, N, is increased as the symbol rate decreases. Moreover, the sample rate $NR_s$ is always between 3.0 to 4.5 times the maximum data symbol rate $(R_{smax})$, and the IF center frequency is always between 3/4 to 9/8 times $(R_{smax})$, irrespective of the actual data rate $R_s$.

6 Claims, 8 Drawing Sheets

HIGHEST OCTAVE OF $R_s$

HIGHEST OCTAVE OF $R_s$

CONTINUOUSLY VARIABLE IF SAMPLING METHOD FOR DIGITAL DATA TRANSMISSION

BACKGROUND OF THE INVENTION

1. Field of the Invention

The present invention relates generally to modulation and demodulation of signals in variable rate information transmission systems. More specifically, the present invention relates to a sampling method for continuously sampling the intermediate frequency associated with digital data transmission.

2. Brief Discussion of Related Art

Modulated signals carry information such as video, data, music and speech. Efficient demodulation requires distinguishing the information from the attendant carrier wave. A general demodulation process includes several steps. The receiver may receive, at its antenna, an information signal modulated on a radio frequency (RF) carrier wave. The signal may then undergo frequency conversion to the intermediate frequency (IF) band. The information signal, at baseband, is recovered from the IF signal by a suitable detector. Considering, for example, a conventional receiver in a variable rate digital data transmission system, the IF signal, produced from a received RF signal by subjecting the RF signal to a mixing or filtering process, is subsequently applied to a data detector for recovering, at baseband, the information content of the input signal.

Figure 1A:
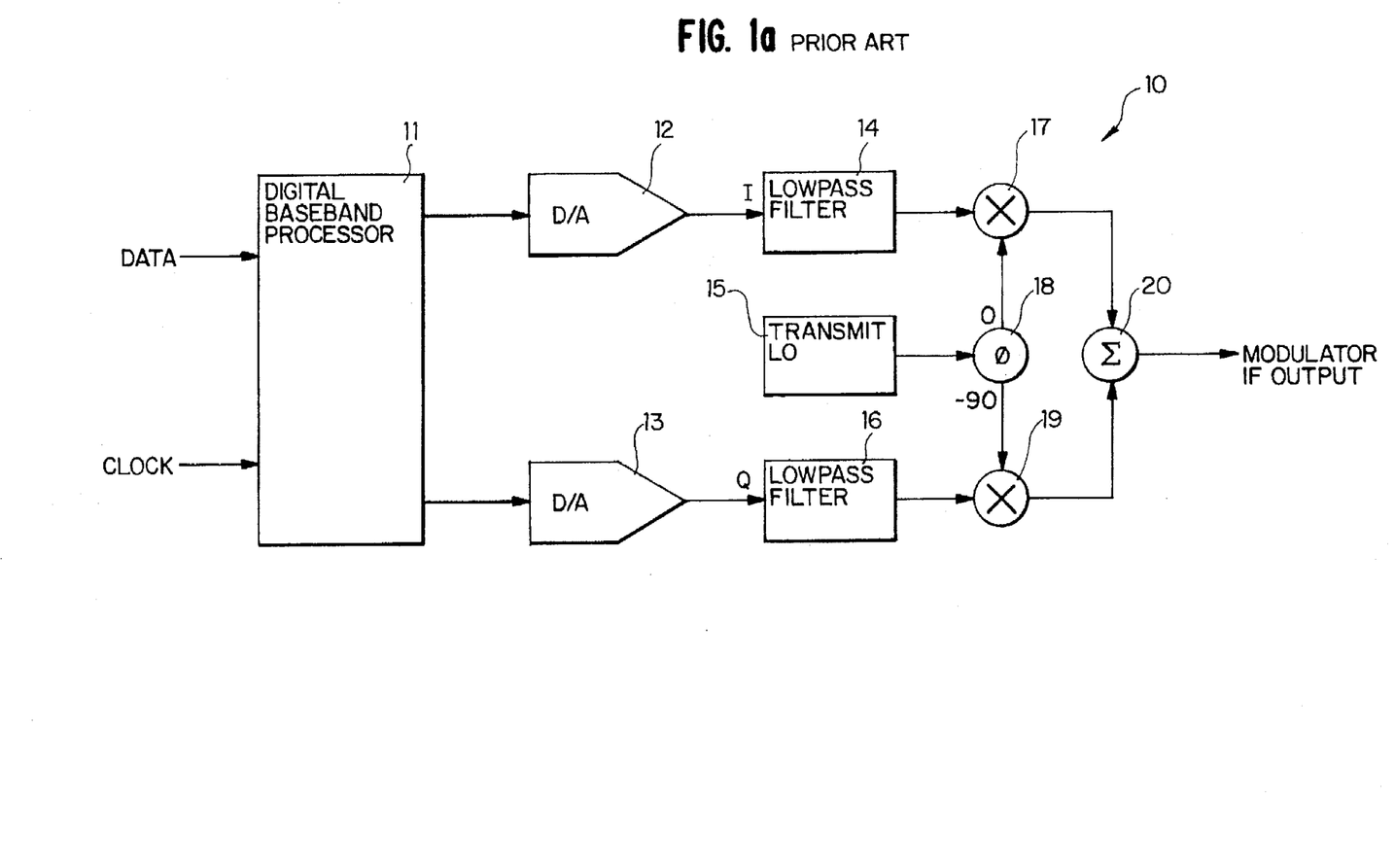
FIGS. 1A and 1B are high-level block diagrams of a baseband sampled modulator and baseband sampled demodulator, respectively, using conventional transmitters and receivers.
Figure 1B:
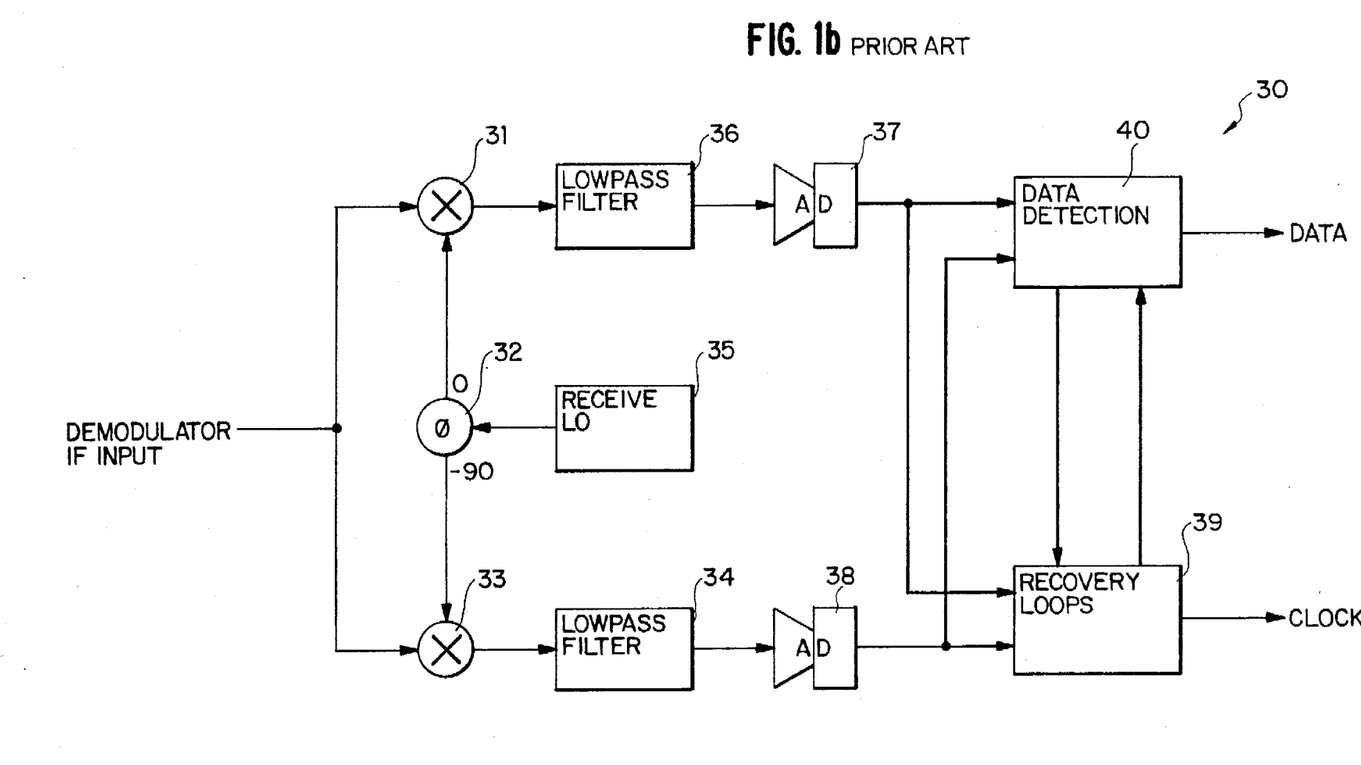

There are fundamentally two types of practical sampling techniques or methods: baseband sampling and IF sampling. To generate or recover an arbitrary bandpass signal with baseband sampling, the information signal must be frequency translated between an IF carrier frequency and baseband in the analog domain as shown in FIGS. 1A and 1B. In-phase and quadrature (I and Q) D/A or A/D converters are used to transfer the samples between the digital and analog domains.

It will be noted that any phase imbalance in the analog quadrature frequency translation causes crosstalk between the channels. Carrier feedthrough in the analog mixing process results in DC offsets in both the I and Q channels. It will also be noted that the amplitude needs to be balanced between the channels. In terms of the data symbol rate ($R_s$), the minimum integer-multiple baseband sample rate that can be used in each parallel I and Q channel is $2R_s$, or two samples-per-symbol (s/s).

Figure 2A:
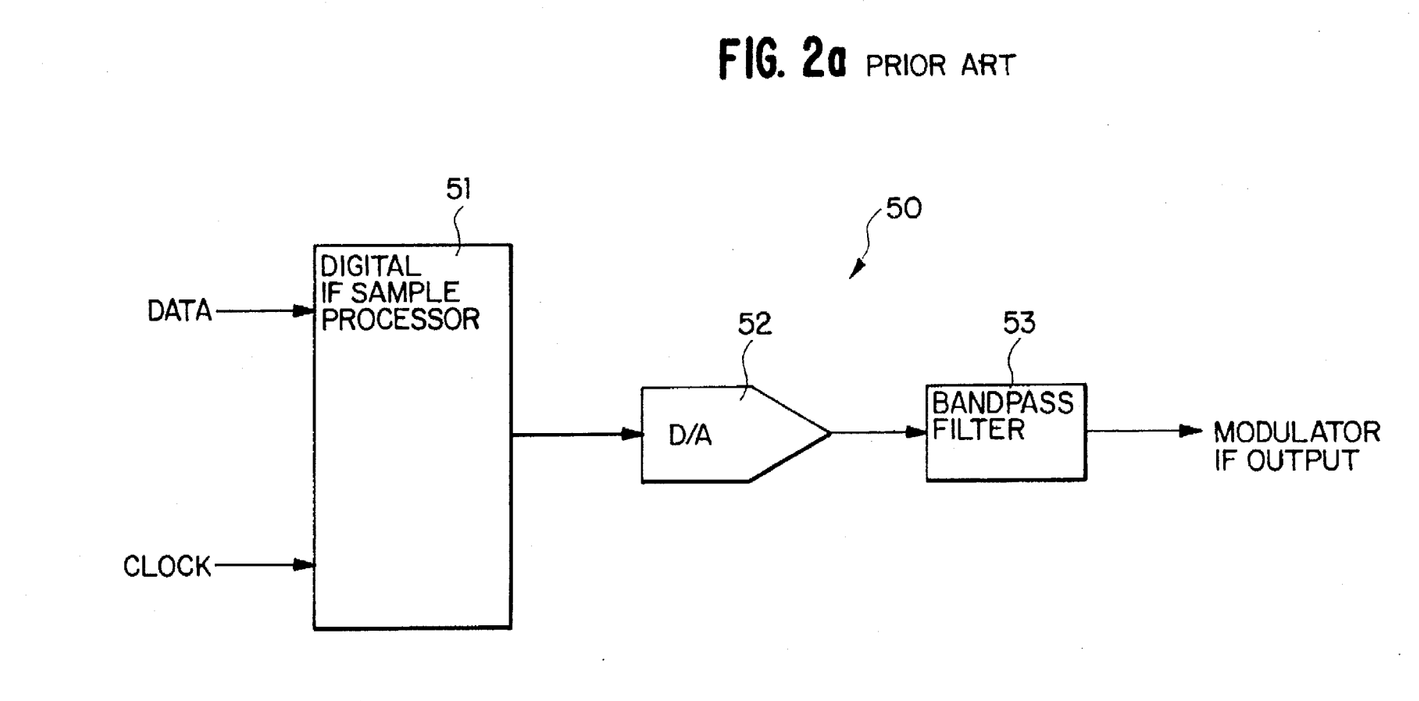
FIGS. 2A and 2B are high-level block diagrams of intermediate frequency (IF) sampled modulator and demodulator systems for respective transmitter and receiver components.
Figure 2B:
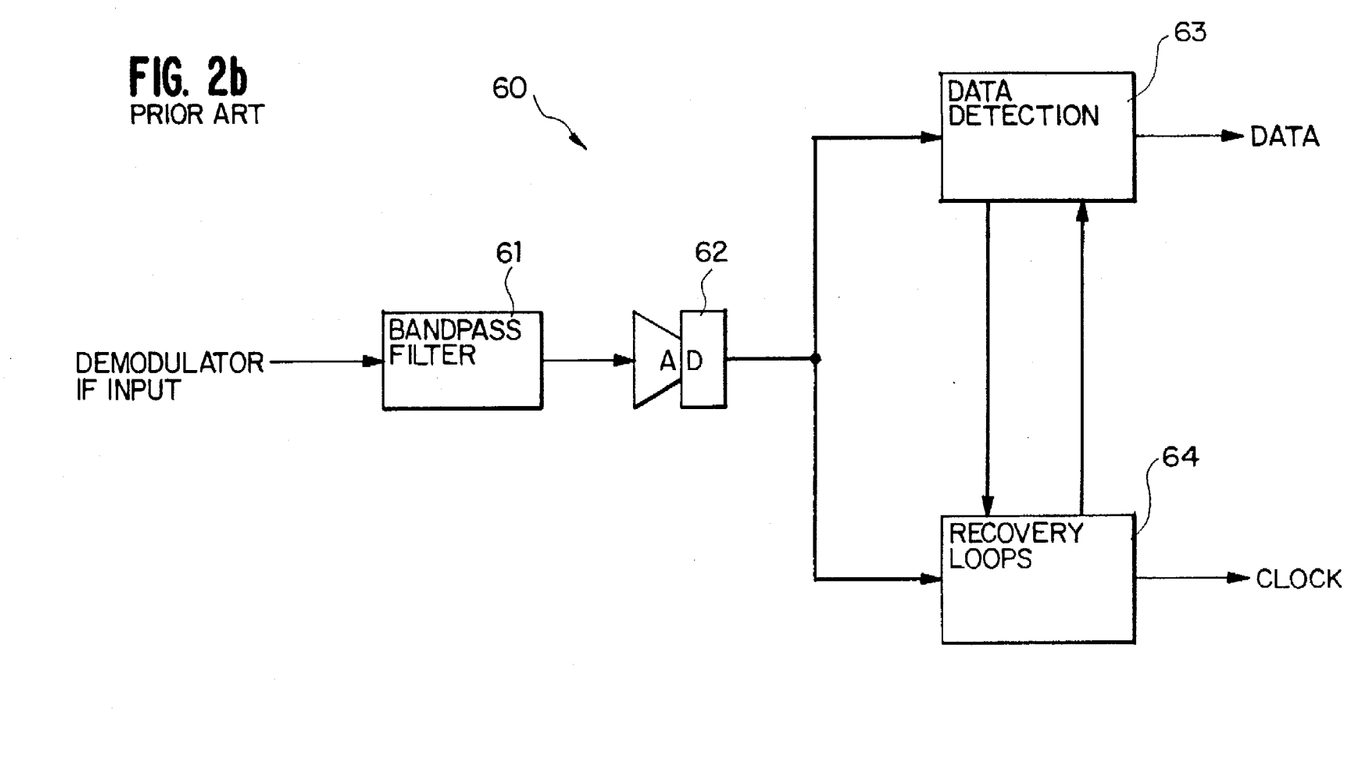

With IF sampling, the bandpass signal is sampled directly, so only a single D/A or A/D converter and attendant bandpass filter are needed, as illustrated in FIGS. 2A and 2B. The digital IF samples are typically translated to baseband for processing. It is a trivial matter to set up this translation in the digital domain so there is no carrier frequency phase imbalance, hence, no I/Q crosstalk. For example, with the IF centered at $R_s$ and sampled at 4 s/s, the quadrature translation can be implemented through multiplication by cosines and sines whose sample values are (+1, 0, −1, 0) and (0, +1, 0, −1), respectively. Furthermore, because of the digital translation there are no DC offsets or amplitude balance impairments.

It will be noted that the system must be responsive to a variable rate signal. Thus, the IF bandwidth must be broad enough to process the highest expected data rate, although at any point in time the receiver may be detecting a lower rate and thus a narrower band signal.

It will be also be recognized that the primary disadvantage associated with IF sampling is that the sample rate at the D/A's and A/D's must typically be higher than the $2R_s$ sampling rate required at baseband to avoid aliasing of the IF spectrum. It must be appreciated that in baseband sampling, the aggregate parallel sample rate of the I and Q channels is actually $4R_s$. Thus, the only major disadvantage with IF sampling is that the D/A and A/D converters must run faster.

U.S. Pat. No. 5,130,802 relates to a television receiving section, and discloses a manner of holding the IF to an integral multiple of the sample clock frequency of the A/D converter to thereby avoid unwanted signal folding or aliasing, wherein the intermediate frequency and the sample clock frequency are fixed depending on boundary conditions.

U.S. Pat. No. 4,859,960 discloses a method of demodulating a signal including a high frequency carrier signal having at least one parameter modulated by a low frequency modulating signal. The method includes translating the signal to a low intermediate frequency and digitizing the translated intermediate frequency signal at a correspondingly low sampling rate. On the other hand, U.S. Pat. No. 4,896,336 achieves symbol synchronization independent of the carrier phase or frequency.

SUMMARY OF THE INVENTION

The principal purpose of the present invention is to provide a simple and efficient means of performing intermediate frequency (IF) sampling in modulators and demodulators for digital data transmission over a broad range of data rate operations. According to one aspect of the invention, the effective range is limited only by the resolution and speed of the D/A and A/D converters.

An object of the of the present invention is to provide a digital transmission and reception system accommodating variable symbol rates wherein only a single low pass filter having a fixed bandwidth can be used at each end of the transmission path. According to one aspect of the invention, only a single analog low pass fixed bandwidth replication-removal filter is provided in the transmission signal path of the transmitter. According to another aspect of the invention, only a single analog low pass fixed bandwidth anti-aliasing filter is provided in the receiver.

These and other objects, features and advantages according to the present invention are provided by a sampling method, denoted continuously variable IF sampling (CVIFS), implemented in digital transmission and reception components. Advantageously, the method can be implemented to achieve these objectives without any hardware changes, i.e., the sampling rate of operation is established simply by programming the associated digital hardware. The use of the CVIFS method allows sampling of a bandpass signal which is centered at an intermediate frequency $f_{IF}$ that is related to both the data transmission symbol rate ($R_s$) and sample rate ($NR_s$) by integer ratios. In this manner, the implementationally cumbersome problem of sample interpolation is avoided.

These and other objects, features and advantages according to the present invention are provided by a CVIFS method characterized in that the sample rate $NR_s$ is constrained to be four times the IF center frequency, and both the sample rate $NR_s$ and the IF center frequency are constrained to be within a range of a factor of 1.5 of their maximum values. To maintain this high sample rate as the data symbol rate is lowered, a "gear shifting" technique is utilized whereby the integer number of samples-per-symbol, N, is roughly proportionally increased. Moreover, the sample rate $NR_s$ is always between 3.0 to 4.5 times the maximum data symbol rate ($R_{smax}$), and the IF center frequency is always between 3/4 to 9/8 times ($R_{smax}$), irrespective of the actual data rate $R_s$.

These and other objects, features and advantages of the invention are disclosed in or apparent from the following description of preferred embodiments.

BRIEF DESCRIPTION OF THE DRAWINGS

The preferred embodiments are described with reference to the drawings in which like elements are denoted by like or similar numbers and in which.

DESCRIPTION OF THE PREFERRED EMBODIMENTS

When a single-rate, fixed bandwidth analog signal is to be IF sampled and processed digitally, numerous well-known techniques could be applied, which techniques do not address the more general problem of digitally processing a continuously variable rate signal in an efficient manner. For example, as described above, a hardware efficient IF sampling technique for processing a fixed rate signal is to set the IF frequency equal to the data symbol rate and sample at four samples per symbol, or equivalently four times the IF carrier frequency. This technique greatly simplifies the subsequent processing, as conversion of the samples from IF to baseband merely entails multiplication by ±1 and 0. In addition, because of the multiplications by zero, the sampling rate can immediately be decimated by a factor-of-two in both the cosine and sine quadrature channels. However, when the data rate is variable over a relatively broad range, the IF frequency will change, and the analog filters required on the transmit side for sample clock replication removal (RR) as well as the receive side for anti-aliasing (AA) must be modified, e.g., scaled. It will be appreciated that single fixed bandwidth RR and AA filters are desirable.

The digital processing required for data transmission on both the transmit and receives sides advantageously can be greatly simplified when an integer number of s/s is used, where some of the receive samples are phase coherent with the data detection and transition points. With non-integer numbers of s/s, interpolating filters are needed to convert to integer s/s. Moreover, not only are these filters very hardware intensive but they also substantially increase the complexity of the sample processing. As discussed above, processing can be further simplified if the data sample rate is four times the IF center frequency, which is advantageously an integer ratio multiple of the data symbol rate. It will be appreciated that an integer relationship between the data symbol rate, sample rate, and the IF center frequency is desirable.

The CVIFS technique avoids all of the disadvantages associated with previous baseband and IF sampling methods with the single exception of increasing the maximum rate at which the D/A and A/D converters must operate. A better understanding of the CVIFS technique can be had by examining the maximum and minimum symbol rate extremes at different numbers of samples-per-symbol, N, for both the modulator and demodulator, thereby demonstrating continuously variable rate operation. Preferably, there will always be two integer values of N within each octave of $R_s$, that is, N=(4,6); (8,12); (16,24); . . .; for octaves 1,2,3, . . . This technique of bracketing N in each octave of $R_s$ will hereafter be referred to as "gear shifting". A baseband sampling version of this gear shifting scheme was discussed in a paper by the instant inventor entitled "Programmable Digital Modem", presented at the NASA Space Communications Technology in November, 1991, which is incorporated herein for all purposes.

Figure 3A:
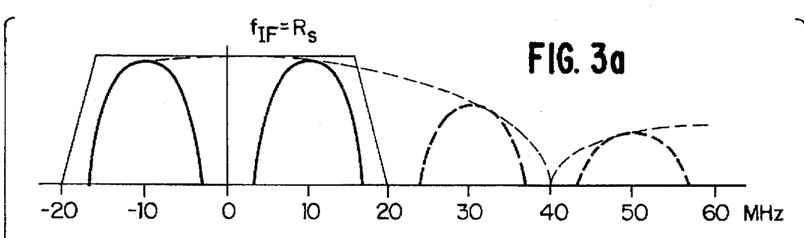
FIGS. 3A through 3F are illustrative waveforms which are useful in explaining the operation of continuously variable IF sampling in a transmitter according to the present invention.
Figure 3B:
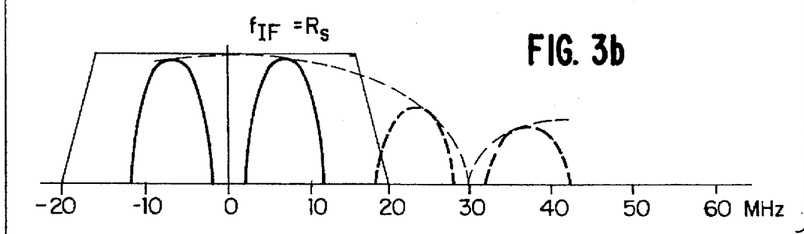

A conceptual diagram of the desired modulated signal spectral range is given in FIGS. 3A and 3B. As shown in these figures, $R_{smax}$ has been set to 10 Msymbol/s for the purpose of illustration. It will be appreciated that a fixed RR low pass filter outline is situated between −20 and +20 MHz. Preferably, this filter has a single-sided bandwidth of 1.6 $R_{smax}$ and a 30 dB shape factor of 1.25: The sin(x)/(x) rolloff envelope of the D/A converter is also indicated by the dashed lines in FIGS. 3A and 3B. Advantageously, all of the frames reflect modulated bandwidth spectral occupancies of 1.4 $R_s$, although it should be noted that this is not a restriction. The subject IF sampling scheme should perform well over the entire range of Nyquist filtered spectral occupancies, $R_s$ to $2R_s$.

FIG. 3A corresponds to the desired IF output when the sample rate, $NR_s$, is $4R_{smax}$ and the IF center frequency, $f_{IF}$, is $R_{smax}$. As will soon become apparent, the ratio of these two quantities will always be 4. It will be appreciated that the main spectral lobe at the minimum symbol rate is easily contained within the RR filter's bandwidth, and the replicated spectra centered at integer multiples of the sample clock are readily attenuated. The minimum symbol rate to be used with 4 s/s is 7.5Msymbols/s as shown in FIG. 3B. Again, it will be appreciated that the IF center frequency has slid down and the RR filter is just able to reject the first replicated lobe. These exemplary cases represent the extremes of operation at N=4 s/s.

Figure 3C:
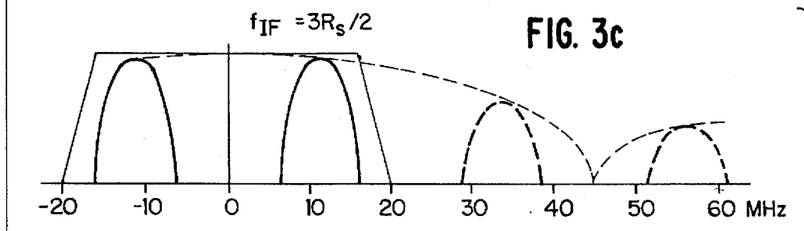
Figure 3D:
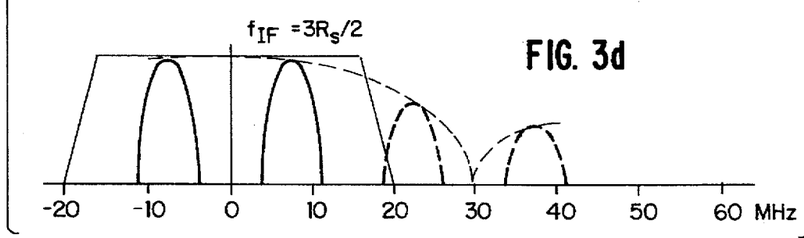

For the range of 5.0<$R_s$<7.5Msymbols/s, N is set equal to 6 s/s, as shown with respect to FIGS. 3C and 3D, wherein operation at the extremes of this range are depicted. It should be appreciated from inspection of these figures that RR filtering becomes progressively less critical in terms of passing the main lobe and rejecting the replications as $R_s$ is continually lowered. Moreover, the IF center frequency and sample rate advantageously are equal to $NR_s/4$ and $NR_s$ for all rates of operation. Preferably, these values are always bounded by (1.125 $R_{smax} \geq f_{IF} > 0.75$ $R_{smax}$) and (4.5 $R_{smax} \geq NR_s > 3.0$ $R_{smax}$), respectively.

The relationships between N, $R_s$, $f_{IF}$, and $NR_s$ are illustrated in Table 1, below, for $R_{smax}$=10Msymbol/s. While only 3 octaves of $R_s$ are listed in Table 1, the pattern for subsequent octaves is easily extrapolated from the information provided.

TABLE 1

Modulator Gear Shifting ($R_{smax}$ = 10 Msymbol/s)

| Samples/Symbol (s/s) | Symbol Rate (Msymbols/s) | IF Center Freq (MHz) | Sample Rate (Msamples/s) |
|---|---|---|---|
| N = 4 | $10 \geq R_S > 7.5$ | $10 \geq f_{IF} > 7.5$ | $40 \geq NR_S > 30$ |
| N = 6 | $7.5 \geq R_S > 5.0$ | $11.25 \geq f_{IF} > 7.5$ | $45 \geq NR_S > 30$ |
| N = 8 | $5.0 \geq R_S > 3.75$ | $10 \geq f_{IF} > 7.5$ | $40 \geq NR_S > 30$ |
| N = 12 | $3.75 \geq R_S > 2.5$ | $11.5 \geq f_{IF} > 7.5$ | $45 \geq NR_S > 30$ |
| N = 16 | $2.5 \geq R_S > 1.875$ | $10 \geq f_{IF} > 7.5$ | $40 \geq NR_S > 30$ |
| N = 24 | $1.875 \geq R_S > 1.25$ | $11.25 \geq f_{IF} > 7.5$ | $45 \geq NR_S > 30$ |

From Table 1 it can be seen that in order not to restrict the maximum sample processing rate, the IF frequency must remain relatively low. Consequently, a second frequency translation will typically be needed. However, the lower the IF center frequency, the more difficult it is to separate the image band resulting from the second mixing process.

Figure 3E:
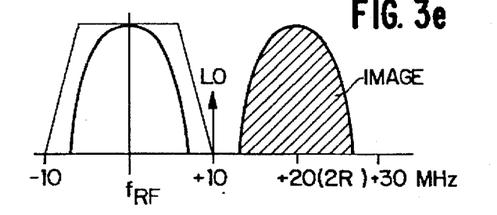
Figure 3F:
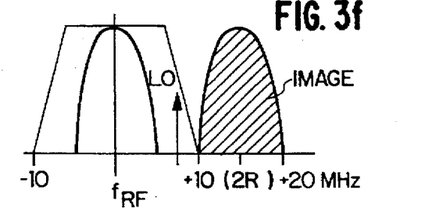

The advantage of keeping the IF frequency in a bounded range in the upper region of the RR filter's pass band becomes readily apparent by inspecting FIGS. 3E and 3F. It is clear from these figure that both the image and the local oscillator (LO) feedthrough can easily be separated with a bandpass filter at the worst case extremes of operation shown, provided that the filter characteristic is sufficiently narrow. In an exemplary case, the ratio of stop band bandwidth to center frequency in a practical crystal filter can be as low as 0.2% at center frequencies from 10 kHz to 100 MHz. Advantageously, the maximum symbol rate can be as small as the RF center frequency divided by $5 \times 10^2$ ($f_{RF}$=10 MHz, $R_{smax}$=20 KHz).

Figure 4:
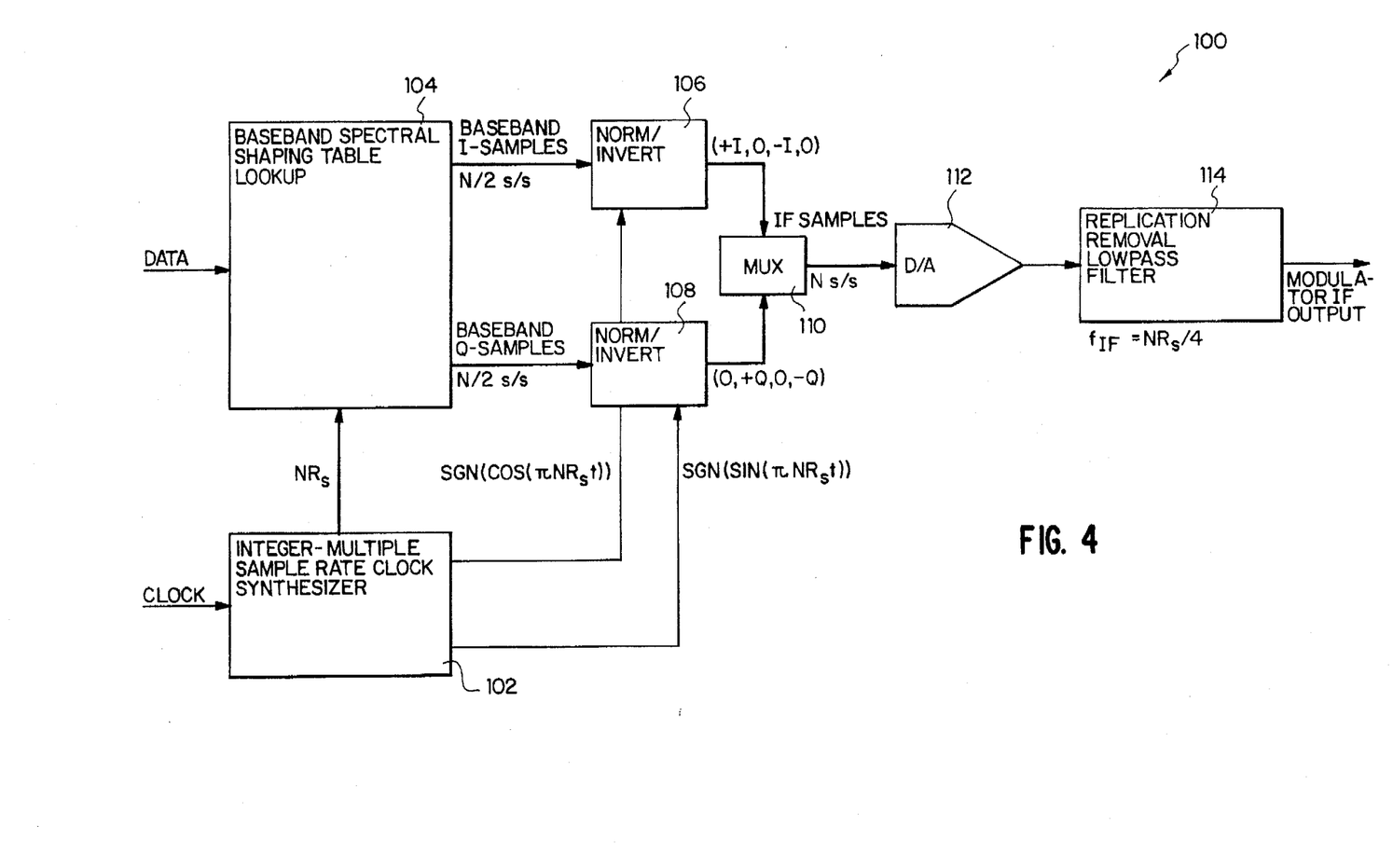
FIG. 4 is a high-level block diagram of a continuous variable IF sampling modulator for a transmitter according to the present invention.

FIG. 4 is a high level block diagram of an exemplary digital data transmission modulator 100 implementation with IF sampling according to the CVIFS technique according to the present invention. Modulator 100 advantageously includes an integer-multiple sample rate clock synthesizer 102, connected to both a baseband spectra shaping lookup table 104 and normal/inverting circuits 106, 108, the outputs of which are provided to digital-to-analog (D/A) converter 112 via multiplexer 110. Advantageously, the output of D/A converter 112 is provided to RR lowpass filter 114.

It will be appreciated that an integer multiple sample rate clock must be synthesized from the incoming data clock. Moreover, in order to generate arbitrary bandpass signal spectra, two quadrature baseband modulating channels are necessary, designated I and Q. For simplicity, the incoming data is mapped into equivalent I and Q baseband samples. The baseband samples are translated up to the IF frequency by multiplication with cosine and sine samples at the IF frequency. Because the sample rate is always 4 $f_{IF}$, the cosine and sine samples are (+1, 0, −1, 0) and (0, +1, 0, −1), respectively. Hence, the I and Q channels need only be sampled at half the IF sample rate for all possible data rates of operation. The ±1 multiplication can be realized with simple normal/invert gating circuits 1006, 108 with one's complement or sign and magnitude arithmetic. Advantageously, because of the staggered multiplication by zero, the modulated samples can simply be multiplexed together into a single IF stream, using multiplexer 110, rather than being summed. The D/A converter 112 converts the samples into the analog domain and imparts a sin(x)/(x) envelope on their spectra due to its inherent sample-and-hold effect. Finally, a single replication-removal low pass filter 113 advantageously can be used to eliminate spectral replications at multiples of the sample clock frequency, thus and the resulting IF output is centered at $NR_s/4$.

A conceptual diagram of the demodulated signal spectra is shown in FIGS. 5A–5F. From inspection of these figures, as well as FIG. 6, it will be appreciated that the sample-and-hold (S&H) aperture in the receive A/D 204, which is described in greater detail below, advantageously can be typically narrow enough that its sin(x)/(x) rolloff effects can be ignored. It will also be appreciated that the sample clock replicated spectra are not significantly attenuated. The AA filter 202 has the same bandwidth and shape factor as the RR filter 114 used on the modulator 100. However, its stop band attenuation preferably is increased to about 40 dB, as the sample and hold effect doesn't provide much residual attenuation.

Figure 5A:
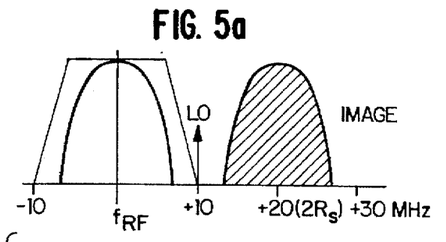
FIGS. 5A through 5F are illustrative waveforms which are useful in understanding the operation of a receiver implementing continuously variable information IF sampling according to the present invention.
Figure 5B:
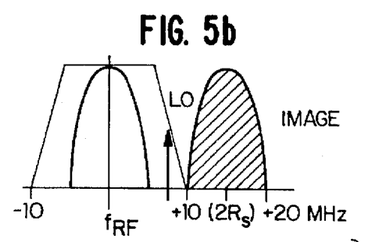
Figure 5C:
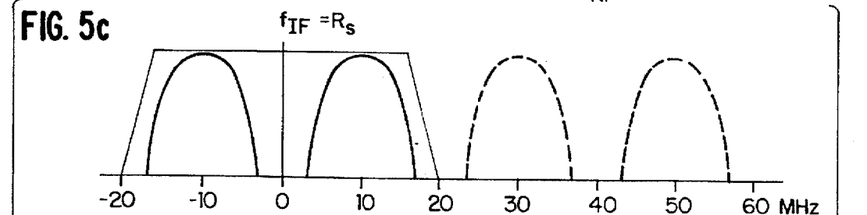
Figure 5D:
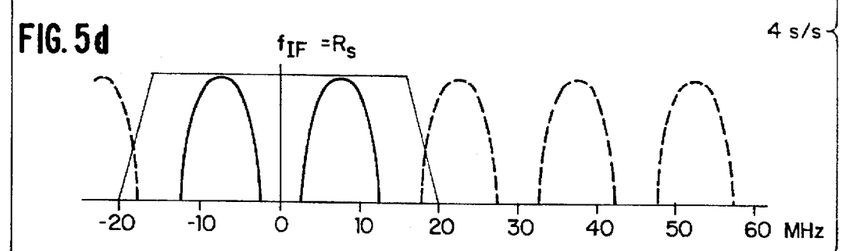
Figure 5E:
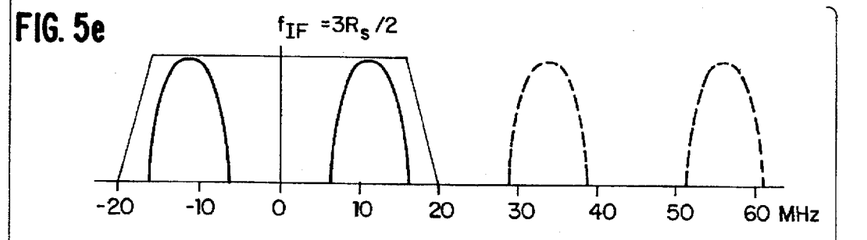
Figure 5F:
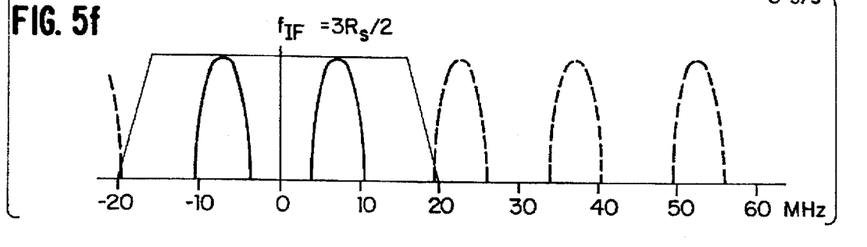

It will be appreciated that the image problem depicted in FIG. 5A is substantially identical to FIG. 3E regarding modulator 100 and that the same image reject filter could be used. Moreover, it should be noted that all of the pertinent sampling parameters (N, $R_s$, $NR_s$, and $f_{IF}$) scale in exactly the same way for demodulator 200 as they did for modulator 100. For example, the sample rate is always four times the IF center frequency, the sample rate and IF frequency are constrained to be within a range of 1.5, and each octave of operation is broken up into two regions with different integer numbers of s/s. An additional advantage which can be attributed to the CVIFS technique is the commonality of the transmit and receiver IF frequencies, their image, RR, and AA filters, their maximum sample rates, as well as their sample rate gear shifting.

Figure 6:
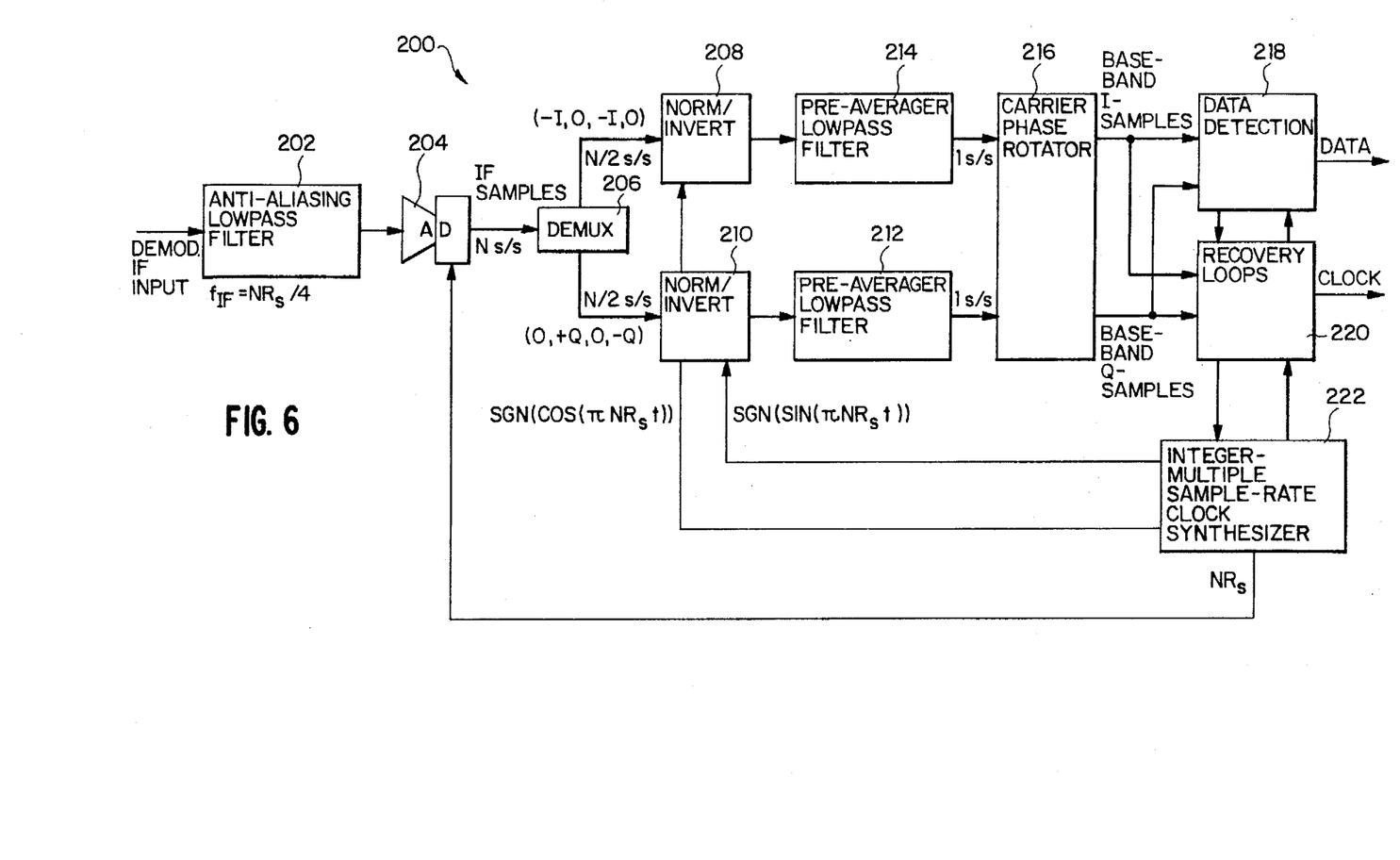
FIG. 6 is a high-level block diagram of a continuous variable IF sampling demodulator used in a receiver according to the present invention.

The high level block diagram for demodulator 200 in FIG. 6 has much of the same functionality as that of modulator 100, albeit in reverse order. In addition, however, the demodulator data must be filtered and detected; the incoming signal's amplitude, carrier and symbol timing phase must be recovered and tracked.

Advantageously, the incoming analog signal will be centered at an IF frequency of $NR_s/4$ and, in an exemplary case, will be is passed through a low pass AA filter 202 is followed by an A/D converter 204, which is sampled at $NR_s$. It will be appreciated that the sample rate is demultiplexed into I and Q channels by demultiplexer 206 and decimated by a factor-of-two prior to baseband translation. Because of the ±1 multiplication, only simple normal/invert gating circuitry 208, 210 is required. With the samples now at baseband, the CVIFS technique can be used in conjunction with U.S. Pat. Nos. 5,052,027 and 5,216,696, which patents are incorporated herein by reference for all purposes, which disclose a pre-averaging technique used to reduce the sample rate for subsequent processing to 1 s/s.

In general, carrier frequency translation in the transmission link will result in an IF frequency offset, thereby causing a beat note in the I and Q channels. The beat note is easily removed with a carrier phase rotator 216, which performs a 2×2 matrix multiplication of the baseband I and Q channels with cosines and sines of the carrier phase tracking loop output. Typically, beat notes as large as 10% of the data symbol rate can be removed. The CVIFS technique advantageously cannot be said to restrict this range. Since the sample rate is always an integer multiple of the symbol rate, the sample rate timing clock, $NR_s$ is actually recovered in the clock tracking loop 220, and the symbol timing clock, $r_s$ is obtained through division by N for output from clock synthesizer 222. The normal/invert IF frequency translation signals are procured with respect to the sample clock divided by two.

It will be appreciated that the above described modulator and demodulator can be provided by an IF sampling mechanism accommodating a continuously variable rate operation by software changes; thus the preferred embodiments of the modulator and demodulator can be obtained without any hardware changes. Moreover, it will be appreciated that the gear shifting permits maximum image separation of the modulator and demodulator carrier IF frequencies, which results in a reduction in the complexity of the image rejection filter. Additionally, the use of gear shifting permits maintenance of the sample rate at a factor of four times the IF frequency over the entire range of symbol rates to be processed.

Other modifications and variations to the invention will be apparent to those skilled in the art from the foregoing disclosure and teachings.

In an exemplary case representing yet another embodiment of the CVIFS technique, the overall sample rate would be doubled, i.e., sampling at 8 s/s for the highest symbol rate of operation while centering the IF frequency at $2R_s$. Advantageously, this has the effect of permitting easier image rejection, albeit at the expense of reducing the maximum rate of operation by half.

It will be appreciated that RR and AA filters 114 and 202, respectively, with slightly different characteristics can advantageously be used, e.g., the filters could be alternating current (AC) coupled which, it will be readily noted, would render the RR and AA filters bandpass filters.

Advantageously, the CVIFS approach permits an extremely broad data rate range of operation using sample analog RR and AA filtering without additional costly or complex hardware changes, permits elimination of the interpolating filters often associated with other systems, while eliminating quadrature amplitude and phase balance as well as the DC offset adjustments commonly associated with IF-to-baseband conversion in analog front-ends with baseband sampling. Additionally, only a single D/A and A/D converter and analog filter are required on the transmit and receive sides, respectively.

It will also be appreciated that regardless of the data rate of operation, the conversion between the baseband and IF samples is always carried out at the same 4 samples-per-IF carrier cycle, which advantageously can be implemented using simple and robust normal/invert and multiplexing circuitry or software equivalents. Preferably, the sample rate is also decimated by a factor-of-two immediately prior to the D/A and immediately after the A/D conversion for all of the subsequent processing. Using the CVIFS technique, the requirements regarding image the rejection filter are simplified because the desired band and image band are maintained as far apart as possible. The CVIFS technique also permits the spectral occupancy of the IF sampled signal to be spread over the entire Nyquist band, $R_s$ to $2R_s$.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. An intermediate frequency (IF) sampling method for continuously sampling the intermediate frequency associated with digital data transmission in a communications channel, said method comprising the steps of:

sampling a signal centered on an intermediate frequency $f_{IF}$ which is related to both data transmission rate ($R_S$) and sample rate ($NR_S$) by an integer ratio; and varying an integer number N of samples per symbol inversely with respect to a change is data symbol rate while maintaining said sampling rate at least equal to a Nyquist rate.

2. The intermediate frequency (IF) sampling method as recited in claim 1, further comprising the steps of constraining said sample rate $NR_S$ to be four times an IF center frequency and constraining both said sample rate $NR_S$ and said IF center frequency to be within a range between 1.5 times and four times respective maximum values of said sample rate $NR_S$ and said IF center frequency.

3. The intermediate frequency (IF) sampling method as recited in claim 1, further comprising the steps of constraining said sample rate $NR_S$ to be within a range of 3.0 to 4.5 times a maximum data symbol rate $R_{SMAX}$ and constraining both said IF center frequency to be always be between 3/4 and 9/8 times said maximum data symbol rate $R_{SMAX}$.

4. An intermediate frequency (IF) sampling apparatus for continuously sampling the intermediate frequency associated with digital data transmission in a communications channel, said apparatus comprising:

means for sampling a signal centered on an intermediate frequency $f_{IF}$ which is related to both data transmission rate ($R_S$) and sample rate ($NR_S$) by an integer ratio; and means for varying an integer number N of samples per symbol inversely with respect to a change is data symbol rate while maintaining said sampling rate at least equal to a Nyquist rate.

5. The intermediate frequency (IF) sampling apparatus as recited in claim 4, further comprising:

means for constraining said sample rate $NR_S$ to be four times an IF center frequency; and means for constraining both said sample rate $NR_S$ and said IF center frequency to be within a range between 1.5 times and four times respective maximum values of said sample rate $NR_S$ and said IF center frequency.

6. The intermediate frequency (IF) sampling apparatus as recited in claim 4, further comprising:

means for constraining said sample rate $NR_S$ to be within a range of 3.0 to 4.5 times a maximum data symbol rate $R_{SMAX}$; and means for constraining both said IF center frequency to be always be between 3/4 and 9/8 times said maximum data symbol rate $R_{SMAX}$.

\* \* \* \* \*

UNITED STATES PATENT AND TRADEMARK OFFICE
CERTIFICATE OF CORRECTION

PATENT NO.   : 5,696,796
DATED        : December 9, 1997
INVENTOR(S)  : John James Poklemba It is certified that error appears in the above-identified patent and that said Letters Patent is hereby corrected as shown below:

The title page, showing an illustrative figure, should be deleted and substitute therefor the attached title page.

Delete Drawing Sheet 8 and substitute therefor the Drawing Sheet, consisting of FIG. 6, as shown on the attached page.

Signed and Sealed this

Ninth Day of February, 1999

Attest:

*Attesting Officer*

*Acting Commissioner of Patents and Trademarks*

United States Patent
Poklemba

Patent Number: 5,696,796
Date of Patent: Dec. 9, 1997

[54] CONTINUOUSLY VARIABLE IF SAMPLING METHOD FOR DIGITAL DATA TRANSMISSION

[75] Inventor: John James Poklemba, Ijamsville, Md.

[73] Assignee: Comsat Corporation, Bethesda, Md.

[21] Appl. No.: 483,764

[22] Filed: Jun. 7, 1995

[51] Int. Cl.⁶ .................. H03K 9/00; H04L 27/06; H04L 27/14; H04L 27/22

[52] U.S. Cl. ............................ 375/316; 332/103

[58] Field of Search .................. 375/316, 326; 332/103; 329/129

[56] References Cited

U.S. PATENT DOCUMENTS

| | | | |
|---|---|---|---|
| 3,864,632 | 2/1975 | Chang | 325/42 |
| 3,868,658 | 2/1975 | Kiemle | 340/173 |
| 4,308,502 | 12/1981 | Brolin | 328/151 |
| 4,403,036 | 9/1983 | Hartley et al. | 435/317 |
| 4,481,646 | 11/1984 | Godard | 375/77 |
| 4,485,404 | 11/1984 | Tults | 358/195.1 |
| 4,506,228 | 3/1985 | Kammeyer | 329/107 |
| 4,707,841 | 11/1987 | Yen et al. | 375/106 |
| 4,773,083 | 9/1988 | Baumbach et al. | 375/100 |
| 4,859,960 | 8/1989 | Standford et al. | 329/126 |
| 4,896,336 | 1/1990 | Henely et al. | 375/80 |
| 5,130,802 | 7/1992 | Ruprecht et al. | 358/188 |
| 5,225,795 | 7/1993 | Iinuma | 332/100 |
| 5,265,126 | 11/1993 | Yoshikawa | 375/27 |
| 5,311,550 | 5/1994 | Fouche et al. | 375/38 |
| 5,375,146 | 12/1994 | Chalmers | 375/350 |
| 5,515,400 | 5/1996 | Arai | 375/261 |
| 5,535,245 | 7/1996 | Kim | 345/261 |

OTHER PUBLICATIONS

*Single Chip Digital Down Converter Simplifies RF DSP Applications*, D. Chester et al, RF Design, Nov. 1992.
*A Digital Turner for Wideband Receivers*, C. Olmstead et al., DSP Applications, Sep. 1992, pp. 2–7.
*Undersampling Techniques Simplify Digital Radio*, R. Groshong et al., Electronic Design, May 23, 1991, pp. 3–95 to 3–101.
*Exploit Digital Advantages in an SSB Receiver* by R. Groshong et al., Electronic Design, Jun. 23, 1991, pp. 3–103 to 3–107.
*Using Wide Dynamic Range Converters for Wide Band Radios* by B. Brannon, RF Design, May 1995, pp. 50–65.
*Digital IF Processing* by C. Olmstead et al., RF Design, Sep. 1994, pp. 30–40.

*Primary Examiner*—Stephen Chin
*Assistant Examiner*—Mohammad Ghayour
*Attorney, Agent, or Firm*—Sughrue, Mion, Zinn, Macpeak & Seas, PLLC

[57] ABSTRACT

A sampling method, denoted continuously variable IF sampling (CVIFS), implemented in digital transmission and reception components is characterized by sampling a bandpass signal which is centered at an intermediate frequency $f_{IF}$ that is related to both the data transmission symbol rate ($R_s$) and sample rate ($NR_s$) by integer ratios. Moreover, the CVIFS method is characterized in that the sample rate $NR_s$ is constrained to be four times the IF center frequency, and both the sample rate $NR_s$ and the IF center frequency are constrained to be within a range of a factor of 1.5 of their maximum values. To maintain this high sample rate as the data symbol rate is lowered, a "gear shifting" technique is utilized whereby the integer number of samples-per-symbol, N, is increased as the symbol rate decreases. Moreover, the sample rate $NR_s$ is always between 3.0 to 4.5 times the maximum data symbol rate ($R_{smax}$), and the IF center frequency is always between 3/4 to 9/8 times ($R_{smax}$), irrespective of the actual data rate $R_s$.

6 Claims, 8 Drawing Sheets

FIG. 6